(12) United States Patent
Cao et al.

(10) Patent No.: US 12,119,069 B2
(45) Date of Patent: Oct. 15, 2024

(54) ANTI-FUSE MEMORY READING CIRCUIT WITH CONTROLLABLE READING TIME

(71) Applicant: WUXI ESIONTECH CO., LTD., Wuxi (CN)

(72) Inventors: Zhengzhou Cao, Wuxi (CN); Jie Zhu, Wuxi (CN); Yanfei Zhang, Wuxi (CN); Jing Sun, Wuxi (CN); Zhenkai Ji, Wuxi (CN); Zhengnan Ding, Wuxi (CN)

(73) Assignee: WUXI ESIONTECH CO., LTD., Wuxi (CN)

( * ) Notice: Subject to any disclaimer, the term of this patent is extended or adjusted under 35 U.S.C. 154(b) by 237 days.

(21) Appl. No.: 17/955,579

(22) Filed: Sep. 29, 2022

(65) Prior Publication Data

US 2023/0025219 A1 Jan. 26, 2023

Related U.S. Application Data

(63) Continuation of application No. PCT/CN2022/102606, filed on Jun. 30, 2022.

(30) Foreign Application Priority Data

Dec. 3, 2021 (CN) .......................... 202111469885.6

(51) Int. Cl.
*G11C 17/00* (2006.01)
*G11C 7/10* (2006.01)
(Continued)

(52) U.S. Cl.
CPC ............ *G11C 17/18* (2013.01); *G11C 7/1069* (2013.01); *G11C 7/1093* (2013.01); *G11C 7/12* (2013.01)

(58) Field of Classification Search
CPC ........... G11C 17/18; G11C 17/16; G11C 7/12; G11C 8/08; G11C 17/165; G11C 7/06;
(Continued)

(56) References Cited

U.S. PATENT DOCUMENTS 5,978,297 A 11/1999 Ingalls
8,923,085 B2 * 12/2014 Chung ................. G11C 29/022
365/158

FOREIGN PATENT DOCUMENTS

CN 107293331 A 10/2017
CN 112582013 A 3/2021
(Continued)

*Primary Examiner* — Thong Q Le
(74) *Attorney, Agent, or Firm* — Bayramoglu Law Offices LLC (57) ABSTRACT

In an anti-fuse memory reading circuit with controllable reading time, a reading time control circuit generates a control signal corresponding to reading time. Based on a clock signal, a programmable reading pulse generation circuit generates a reading pulse with a pulse width corresponding to the control signal. Based on the reading pulse and the control signal, the reading amplification circuit selects a pull-up current source corresponding to the reading time, pulls up a voltage on a bit line (BL) of an anti-fuse memory cell, reads data stored in the anti-fuse memory cell starting from a rising edge of the reading pulse, and latches the read data at a falling edge of the reading pulse. The anti-fuse memory reading circuit can generate a reading pulse with a corresponding pulse width and a pull-up current source with a corresponding size based on the required reading time.

10 Claims, 3 Drawing Sheets

(51) Int. Cl.
    *G11C 7/12*    (2006.01)
    *G11C 17/18*   (2006.01)
(58) Field of Classification Search
    CPC ... G11C 7/1069; G11C 7/1096; G11C 29/027;
          G11C 7/062; G11C 5/063; G11C 8/14;
          G11C 7/22; G11C 5/06; G11C 7/10;
          G11C 17/10; G11C 2029/1202; G11C
          2029/5006; G11C 29/024; G11C 29/50;
          G11C 29/785; G11C 7/24; G11C 16/10;
          G11C 16/24; G11C 16/26; G11C 11/419;
          G11C 11/24; G11C 11/5692; G11C 5/10;
          G11C 16/0441; G11C 17/08; G11C
          7/1063; G11C 16/28; G11C 2013/0042;
          G11C 2207/002; G11C 2207/005; G11C
          2211/4013; G11C 29/78; G11C 5/145;
          G11C 5/147; G11C 7/065; G11C 7/14;
          G11C 7/18; G11C 17/14; G11C 11/4074;
          G11C 11/4085; G11C 11/4094; G11C
          11/5642; G11C 14/0054; G11C 16/045;
          G11C 16/06; G11C 16/08; G11C 16/14;
          G11C 16/32; G11C 16/34; G11C 17/04;
          G11C 29/18; G11C 29/44; G11C 29/56;
          G11C 7/067; G11C 7/08; G11C 14/0063;
          G11C 5/14; G11C 7/1093; G11C
          11/4096; G11C 16/3454; G11C 16/3459;
          G11C 19/00; G11C 2029/0407; G11C
          29/52; G11C 5/143
    See application file for complete search history.

(56)            References Cited

FOREIGN PATENT DOCUMENTS

CN      113345506 A    9/2021
    CN      114171096 A    3/2022

* cited by examiner

ANTI-FUSE MEMORY READING CIRCUIT WITH CONTROLLABLE READING TIME

CROSS REFERENCE TO THE RELATED APPLICATIONS

This application is the continuation application of International Application No. PCT/CN2022/102606, filed on Jun. 30, 2022, which is based upon and claims priority to Chinese Patent Application No. 202111469885.6, filed on Dec. 3, 2021, the entire contents of which are incorporated herein by reference.

TECHNICAL FIELD

The present disclosure relates to the field of anti-fuse memories, in particular, to an anti-fuse memory reading circuit with controllable reading time.

BACKGROUND

A metal-to-metal (MTM) anti-fuse memory mainly includes an anti-fuse memory bank, which includes an anti-fuse and a programming transistor. The MTM anti-fuse memory performs programming through a puncturable medium between two layers of metal electrode plates to store data. The MTM anti-fuse memory is widely applied owing to its natural anti-radiation performance, high reliability, and high integration.

When the anti-fuse memory is used, a reading circuit is needed to read the data stored in the anti-fuse memory, but the prior anti-fuse memory reading circuits all read the data based on fixed reading time, which makes it difficult to meet actual application needs.

SUMMARY

Technical Problem

The prior anti-fuse memory reading circuits all read data based on fixed reading time, which makes it difficult to meet actual application needs.

Solutions to the Problems

Technical Solutions

To resolve the above problems and meet the above technical requirements, the present disclosure provides an anti-fuse memory reading circuit with controllable reading time. The technical solutions of the present disclosure are as follows:

An anti-fuse memory reading circuit with controllable reading time includes an anti-fuse memory cell. The anti-fuse memory reading circuit includes a reading time control circuit, a programmable reading pulse generation circuit, a reading amplification circuit, and a reading register.

The reading time control circuit generates a control signal that has K control bits and corresponds to reading time and provides the control signal to the programmable reading pulse generation circuit and the reading amplification circuit.

Based on a clock signal, the programmable reading pulse generation circuit generates a reading pulse with a pulse width corresponding to the control signal and outputs the reading pulse to the reading amplification circuit.

The reading amplification circuit includes a plurality of pull-up current sources of different sizes. Based on the reading pulse and the control signal, the reading amplification circuit selects a pull-up current source corresponding to the reading time, pulls up a voltage on a bit line (BL) of the anti-fuse memory cell, reads data stored in the anti-fuse memory cell starting from a rising edge of the reading pulse, and latches the read data into the reading register at a falling edge of the reading pulse.

As a further technical solution, a shorter reading time leads to a smaller pulse width of the corresponding reading pulse and a larger current value of the pull-up current source.

As a further technical solution, the reading time control circuit includes K parallel programming branches. Each of the programming branches includes a pull-up device and a pull-down device that are connected in series. Each of the programming branches is connected to a power supply VDD through the pull-up device and connected to the ground GND through the pull-down device. The common end of the pull-up device and the pull-down device in each of the programming branches is connected to a programming switch. The other terminals of K programming switches are connected to each other and to a programming voltage HV_PGM. The reading time control circuit obtains a programming signal and controls the on/off of the K programming switches based on the programming signal to program the corresponding programming branches. The common end of the pull-up device and the pull-down device in each of the programming branches is configured to output one control bit of the control signal, and at most only one control bit in the control signal is 1.

As a further technical solution, both the pull-up device and the pull-down device in the reading time control circuit are realized by an anti-fuse. The voltage difference between upper and lower metal electrode plates of a pull-up anti-fuse is the difference between the programming voltage HV_PGM and the voltage of the power supply VDD. The voltage difference between the upper and lower metal electrode plates of a pull-down anti-fuse is the difference between the programming voltage HV_PGM and the voltage of the ground GND. The anti-fuses in the corresponding programming branches are programmed by controlling the on/off of the K programming switches based on the programming signal to apply the programming voltage HV_PGM to two ends of the pull-up anti-fuse and the pull-down anti-fuse separately to complete the programming of the pull-up anti-fuse and the pull-down anti-fuse.

When the pull-up anti-fuse is programmed, the voltages of the power supply VDD and the ground GND are adjusted, such that the voltage difference between the upper and lower metal electrode plates of the pull-up anti-fuse exceeds the breakdown voltage of the anti-fuse, and the voltage difference between the upper and lower metal electrode plates of the pull-down anti-fuse is less than the breakdown voltage of the anti-fuse to complete the programming of the pull-up anti-fuse. When the pull-down anti-fuse is programmed, the voltages of the power supply VDD and the ground GND are adjusted, such that the voltage difference between the upper and lower metal electrode plates of the pull-down anti-fuse exceeds the breakdown voltage of the anti-fuse, and the voltage difference between the upper and lower metal electrode plates of the pull-up anti-fuse is less than the breakdown voltage of the anti-fuse to complete the programming of the pull-down anti-fuse, where the resistance value of the anti-fuse is several hundred megaohms when the anti-fuse is not programmed.

As a further technical solution, the programmable reading pulse generation circuit includes a delay circuit, K delay selection switches, and a logic AND gate. The clock signal CLK is input into the delay circuit, and the delay circuit performs multi-stage delaying on the clock signal CLK and leads out clock delay signals with different delay values relative to the clock signal CLK at K different delay stages. Each of the clock delay signals is connected to one delay selection switch. The other terminals of the K delay selection switches are connected to each other and to one input terminal of the logic AND gate. The other input terminal of the logic AND gate is connected to the clock signal CLK, and an output terminal of the logic AND gate is connected to the reading amplification circuit to output the reading pulse.

The K delay selection switches are respectively controlled by the K control bits of the control signal, and the delay selection switch is closed when the corresponding control bit is at a high level and outputs the corresponding clock delay signal to the logic AND gate. A greater delay value of the clock delay signal relative to the clock signal CLK leads to a greater pulse width of the reading pulse.

As a further technical solution, the reading amplification circuit includes a negative channel metal oxide semiconductor (NMOS) discharge transistor MN0, the plurality of pull-up current sources of different sizes, and a current source selection circuit.

A source of the discharge transistor MN0 is grounded. A drain of the discharge transistor MN0 is connected to the reading register through a buffer. An output end of the programmable reading pulse generation circuit is connected to a gate of the discharge transistor MN0 through an inverter. The plurality of pull-up current sources of different sizes are connected to the drain of the discharge transistor MN0 through a selection network, and the drain of the discharge transistor MN0 is further connected to the BL of the anti-fuse memory cell.

Based on the reading pulse and the control signal, the current source selection circuit controls the selection network to allow the pull-up current source corresponding to the reading time to be conductive with the drain of the discharge transistor MN0.

As a further technical solution, the reading amplification circuit includes a reference current source and K additional current sources. The reference current source is connected to a source of a corresponding positive channel metal oxide semiconductor (PMOS) transistor. A drain of the PMOS transistor connected to the reference current source is connected to the drain of the discharge transistor MN0. A gate of the PMOS transistor connected to the reference current source and the gate of the discharge transistor MN0 are connected to each other and to an output terminal of the inverter. The K additional current sources are connected to the drain of the discharge transistor MN0 through the selection network.

The current source selection circuit controls the selection network based on the reading pulse and the control signal, such that when the K additional current sources are all not conductive with the drain of the discharge transistor MN0, a pull-up current source conductive with the drain of the discharge transistor MN0 is formed by the reference current source.

The current source selection circuit controls the selection network based on the reading pulse and the control signal, such that when one of the additional current sources is conductive with the drain of the discharge transistor MN0, the pull-up current source conductive with the drain of the discharge transistor MN0 is formed by superimposing the reference current source and the additional current source that is conductive. One reference current source and the K additional current sources jointly form K+1 different pull-up current sources.

As a further technical solution, the selection network includes K selection PMOS transistors, and the current source selection circuit includes K logic NAND gates.

Each of the additional current sources is connected to a source of a corresponding selection PMOS transistor. Drains of the selection PMOS transistors are all connected to the drain of discharge transistor MN0.

One input terminal of each of the logic NAND gates in the current source selection circuit is connected to the reading time control circuit to obtain one control bit of the control signal, and the other input terminal of each of the logic NAND gates in the current source selection circuit is connected to the programmable reading pulse generation circuit to obtain the reading pulse. An output terminal of each of the logic NAND gates in the current source selection circuit is connected to a gate of a corresponding selection PMOS transistor.

The K logic NAND gates in the current source selection circuit respectively obtain the K control bits of the control signal to control on/off of one corresponding selection PMOS transistor.

As a further technical solution, the reading amplification circuit reads the data stored in the anti-fuse memory cell starting from the rising edge of the reading pulse. When it is read that the anti-fuse memory cell is in an unprogrammed high impedance state, the drain of the discharge transistor MN0 is pulled up to a high level. When it is read that the anti-fuse memory cell is in a programmed low impedance state, the drain of the discharge transistor MN0 remains at a low level and the read data is sent to the reading register.

As a further technical solution, the reading register is designed by a triple modular redundancy technology.

Beneficial Effects of the Present Disclosure

Beneficial Effects

The present disclosure provides an anti-fuse memory reading circuit with controllable reading time. The anti-fuse memory reading circuit can generate a reading pulse with the corresponding pulse width and a pull-up current source with the corresponding size based on a programming signal corresponding to the required reading time and realize user-defined programming control over the reading time, which is highly flexible to meet a user's choice between an actual reading speed and a power consumption requirement.

The reading time control circuit in the anti-fuse memory reading circuit can be further constructed based on an anti-fuse, thereby realizing a low bias current, a small static power consumption, a small occupied circuit area, a high integration level, and no loss in the case of power failure. The reading register is designed by a triple modular redundancy technology, such that the whole reading circuit is highly reliable and has good anti-radiation performance.

DETAILED DESCRIPTION OF THE EMBODIMENTS

Implementations of the Present Disclosure

The specific implementations of the present disclosure will be further described below with reference to the accompanying drawings.

Figure 1:
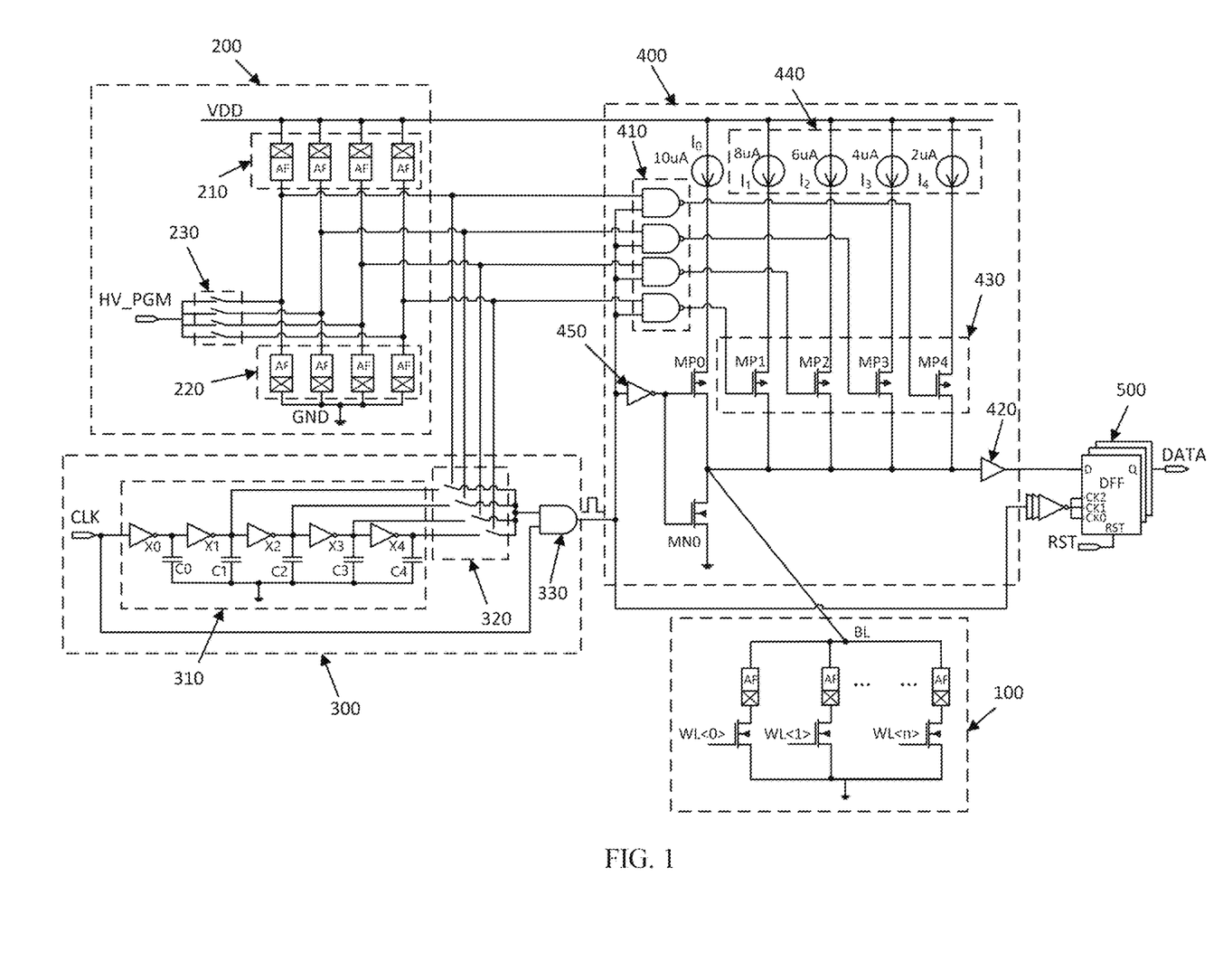
FIG. 1 is a structural diagram of an anti-fuse memory reading circuit according to the present disclosure.

The present disclosure provides an anti-fuse memory reading circuit with controllable reading time. The anti-fuse memory reading circuit is configured to read data in an anti-fuse memory cell 100. The anti-fuse memory cell 100 includes anti-fuses AF and programming transistors. A potential of an upper electrode plate of each of the anti-fuses is controlled by a BL of the anti-fuse memory cell 100, and a lower electrode plate of each of the anti-fuses is grounded through a corresponding programming transistor. A plurality of series structures of the anti-fuse and the programming transistor are connected in parallel to form an array structure. A gate of each of the programming transistors is controlled by a word line (WL). As shown in FIG. 1, gates of n programming transistors are controlled by WLs WL<0>, WL<1>, . . . , and WL<n>, respectively. When it is necessary to read the data from the anti-fuse memory cell 100, the programming transistor is turned on at a high level for a corresponding WL, and the stored data is read by the anti-fuse memory reading circuit.

The anti-fuse memory reading circuit in the present disclosure includes a reading time control circuit 200, a programmable reading pulse generation circuit 300, a reading amplification circuit 400, and a reading register 500, which are separately described below:

1. Reading Time Control Circuit 200

The reading time control circuit 200 generates a control signal that has K control bits and corresponds to the required reading time and provides the control signal to the programmable reading pulse generation circuit and the reading amplification circuit. At most one control bit in the control signal is 1.

Specifically, the reading time control circuit 200 can generate the control signal based on a corresponding instruction or shift register, and different control signals correspond to different reading times. In actual application, the reading time control circuit 200 can be used to generate different control signals, and then the data in the anti-fuse memory cell 100 can be read based on different reading times. This process is equivalent to a debugging process. Through continuous debugging, reading effects in reading time corresponding to different control signals can be determined, and a control signal corresponding to reading time with the best reading effect can be determined as an optimal control signal. In a subsequent working process, the optimal control signal is generated by the reading time control circuit 200.

To avoid generating the optimal control signal based on an external instruction or the like each time, in an embodiment, an internal circuit of the reading time control circuit 200 is programmed to fixedly output the optimal control signal. Specifically, the reading time control circuit 200 includes K parallel programming branches. Each of the programming branches includes a pull-up device 210 and a pull-down device 220 that are connected in series. Each of the programming branches is connected to a power supply VDD through the pull-up device 210 and connected to the ground GND through the pull-down device 220. The common end of the pull-up device 210 and the pull-down device 220 in each of the programming branches is connected to a programming switch 230, and the other terminals of K programming switches 230 are connected to each other and to a programming voltage HV_PGM. The programming voltage HV_PGM is greater than the voltages of VDD and GND. The reading time control circuit 200 obtains a programming signal. The programming signal is a control signal corresponding to the reading time to be finally achieved and generally corresponds to the above optimal control signal. Then the reading time control circuit 200 controls on/off of the K programming switches 230 based on the programming signal to program the corresponding programming branches. A programming branch corresponding to each of the programming switches 230 is a programming branch connected to the programming switch 230. The common end of the pull-up device 210 and the pull-down device 220 in each of the programming branches is configured to output one control bit of the control signal. Therefore, K+1 control signals can be formed through combination through the K control bits. In an example of K=4 shown in FIG. 1, a total of five control signals 0000, 0001, 0010, 0100, and 1000 can be obtained through combination. After programming, the reading time control circuit 200 can output one of the five control signals by default.

In the above circuit structure, the pull-up device 210 and the pull-down device 220 can be realized by an ordinary resistor or other devices. However, in an example of the present disclosure, both the pull-up device 210 and the pull-down device 220 of the reading time control circuit 200 are realized by the anti-fuse. Therefore, the pull-up device 210 realized by the anti-fuse is referred to as a pull-up anti-fuse, and the pull-down device 220 realized by the anti-fuse is referred to as a pull-down anti-fuse. The voltage difference between the upper and lower metal electrode plates of the pull-up anti-fuse is the difference between the programming voltage HV_PGM and the voltage of the power supply VDD. The voltage difference between the upper and lower metal electrode plates of the pull-down anti-fuse is the difference between the programming voltage HV_PGM and the voltage of the ground GND. Anti-fuses in the corresponding programming branches are programmed by controlling the on/off of the K programming switches based on the programming signal to apply the programming voltage HV_PGM to two ends of the pull-up anti-fuse and the pull-down anti-fuse separately to complete the programming of the pull-up anti-fuse and the pull-down anti-fuse.

When the pull-up anti-fuse is programmed, the voltages of the power supply VDD and the ground GND are adjusted, such that the voltage difference between the upper and lower metal electrode plates of the pull-up anti-fuse exceeds the breakdown voltage of the anti-fuse, and the voltage difference between the upper and lower metal electrode plates of the pull-down anti-fuse is less than the breakdown voltage of the anti-fuse to complete the programming of the pull-up anti-fuse. When the pull-down anti-fuse is programmed, the voltages of the power supply VDD and the ground GND are adjusted, such that the voltage difference between the upper and lower metal electrode plates of the pull-down anti-fuse exceeds the breakdown voltage of the anti-fuse, and the voltage difference between the upper and lower metal electrode plates of the pull-up anti-fuse is less than the breakdown voltage of the anti-fuse to complete the programming of the pull-down anti-fuse.

The breakdown voltage of the anti-fuse used in this embodiment ranges from 7 V to 8 V. Therefore, the programming voltage HV_PGM used in this embodiment is 10 V. When the pull-up anti-fuse is programmed, the voltages of the power supply VDD and the ground GND are adjusted to 0 V and 5 V, respectively. In this case, the voltage difference between the upper and lower metal electrode plates of the pull-up anti-fuse is 10 V, which is greater than the breakdown voltage of the anti-fuse, and the voltage difference between the upper and lower metal electrode plates of the pull-down anti-fuse is 5 V, which is less than the breakdown voltage of the anti-fuse, to prevent the pull-up anti-fuse from being broken down. When the pull-down anti-fuse is programmed, the voltages of the power supply VDD and the ground GND are adjusted to 5 V and 0 V, respectively. In this case, the voltage difference between the upper and lower metal electrode plates of the pull-down anti-fuse is 10 V, which is greater than the breakdown voltage of the anti-fuse, and the voltage difference between the upper and lower metal electrode plates of the pull-up anti-fuse is 5 V, which is less than the breakdown voltage of the anti-fuse to prevent the pull-up anti-fuse from being broken down.

The pull-up anti-fuse and the pull-down anti-fuse are in a low impedance state after being programmed, and their resistance values generally range from 50 Ω to 150 Ω. However, the pull-up anti-fuse and the pull-down anti-fuse are in a high impedance state when they are not programmed, and their resistance values reach several hundred megaohms, and specifically are greater than 200 mΩ. Therefore, a bias current of the reading time control circuit 200 is very small, below 0.02 uA. This can reduce the static power consumption of the circuit compared with the practice of realizing the pull-up and pull-down devices by a conventional resistor. In addition, when the pull-up and pull-down devices are realized by the anti-fuse, the occupied circuit area is also small, such that the circuit is highly integrated and has no loss in the case of power failure.

2. Programmable Reading Pulse Generation Circuit 300

Based on a clock signal CLK, the programmable reading pulse generation circuit 300 generates a reading pulse with a pulse width corresponding to the control signal and outputs the reading pulse to the reading amplification circuit. A shorter reading time to be achieved leads to a smaller pulse width W of the reading pulse generated based on the control signal. The control signal can be used to widen a working frequency range and support a higher external CLK clock frequency.

Specifically, the programmable reading pulse generation circuit 300 includes a delay circuit 310, K delay selection switches 320, and a logic AND gate 330. The clock signal CLK is input into the delay circuit 310, and the delay circuit performs multi-stage delaying on the clock signal CLK and leads out clock delay signals with different delay values relative to the clock signal CLK at K different delay stages. A higher delay stage leads to a greater delay value of a corresponding clock delay signal relative to the clock signal CLK. Each of the clock delay signals is connected to one delay selection switch 320. The other terminals of the K delay selection switches 320 are connected to each other and to one input terminal of the logic AND gate 330. The other input terminal of the logic AND gate 330 is connected to the clock signal CLK. In an embodiment, as shown in FIG. 1, taking K=4 as an example, the delay circuit 310 is a multistage cascaded RC delay circuit, where X0 and C0 form a first delay stage, X1 and C1 form a second delay stage, X2 and C2 form a third delay stage, X3 and C3 form a fourth delay stage, and X4 and C4 form a fifth delay stage. The clock delay signal is separately led out at output terminals of the second delay stage, the third delay stage, the fourth delay stage, and the fifth delay stage.

The K delay selection switches 320 are respectively controlled by the K control bits of the control signal, and the delay selection switch 320 is closed when the corresponding control bit is at a high level and outputs the corresponding clock delay signal to the logic AND gate 330. The logic AND gate 330 performs a logic AND operation on the clock signal CLK and the corresponding clock delay signal to generate the reading pulse, and the pulse width of the generated reading pulse is a delay value of the clock delay signal relative to the clock signal CLK. Therefore, the higher delay stage corresponding to the delay selection switch 320 that is closed based on the control signal leads to a greater delay value of the generated clock delay signal relative to the clock signal CLK and a larger pulse width of the reading pulse generated and output to the reading amplification circuit. An output terminal of the logic AND gate 330 is connected to the reading amplification circuit and outputs the generated reading pulse.

3. Reading Amplification Circuit 400

Figure 2:
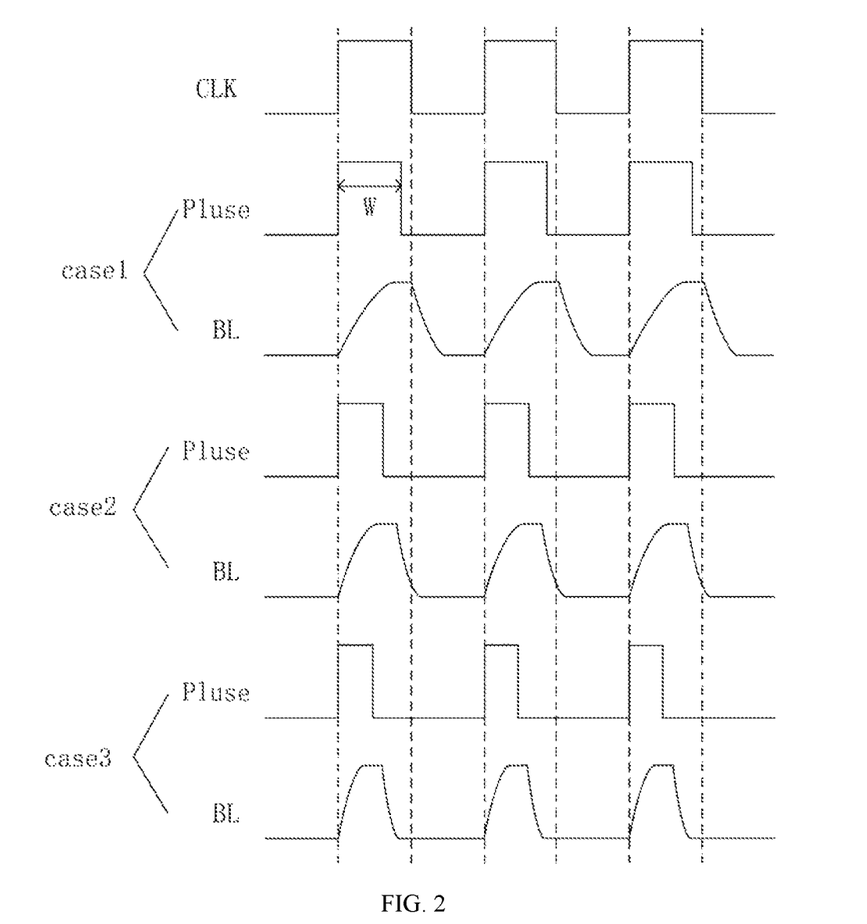
FIG. 2 is a schematic waveform diagram of reading pulses and voltages of a BL of an anti-fuse memory cell in an anti-fuse memory reading circuit under different examples according to the present disclosure.

The reading amplification circuit 400 includes a plurality of pull-up current sources of different sizes. Based on the reading pulse and the control signal, the reading amplification circuit selects a pull-up current source corresponding to the reading time and pulls up a voltage on the BL of the anti-fuse memory cell. A shorter reading time required leads to a larger current value of the corresponding pull-up current source selected based on the reading pulse and the control signal, such that the charging and discharging time of the voltage on the BL of the anti-fuse memory cell is shorter and faster reading is achieved. Referring to FIG. 2, case1, case2, and case3 respectively represent three different examples in which reading time decreases in turn. As shown in FIG. 2, pulse widths W of reading pulses in case1, case2, and case3 decrease in turn. In addition, because current values of selected pull-up current sources increase in turn, as shown in FIG. 2, rising speeds of corresponding voltages on the BL in the three examples increase in turn.

The reading amplification circuit 400 reads data stored in the anti-fuse memory cell starting from a rising edge of the reading pulse and latches the read data into the reading register 500 at a falling edge of the reading pulse. The reading amplification circuit 400 reads the data stored in the anti-fuse memory cell 100 starting from the rising edge of the reading pulse. When it is read that the anti-fuse memory cell 100 is in an unprogrammed high impedance state, a drain of a discharge transistor MN0 is pulled up to the high level. When it is read that the anti-fuse memory cell 100 is in a programmed low impedance state, the drain of the discharge transistor MN0 remains at a low level and the read data is sent to the reading register 500.

The reading amplification circuit 400 includes the NMOS discharge transistor MN0, the plurality of pull-up current sources of different sizes, and a current source selection circuit 410. A source of the discharge transistor MN0 is grounded, the drain of the discharge transistor MN0 is connected to the reading register 500 through a buffer 420, and an output end of the programmable reading pulse generation circuit 300 is connected to a gate of the discharge transistor MN0 through an inverter 450. The plurality of pull-up current sources of different sizes are connected to the drain of the discharge transistor MN0 through a selection network 430, and the drain of the discharge transistor MN0 is further connected to the BL of the anti-fuse memory cell 100. Based on the reading pulse and the control signal, the current source selection circuit controls the selection network 430 to allow the pull-up current source corresponding to the reading time to be conductive with the drain of the discharge transistor MN0.

The reading amplification circuit includes a reference current source $I_0$ and K additional current sources 440. In the example of K=4 shown in FIG. 1, four additional current sources 440 are included and denoted as $I_1$, $I_2$, $I_3$, and $I_4$, respectively. The reference current source $I_0$ is connected to a source of a corresponding PMOS transistor MP0. A drain of the PMOS transistor MP0 connected to the reference current source $I_0$ is connected to the drain of the discharge transistor MN0. A gate of the PMOS transistor MP0 connected to the reference current source $I_0$ and the gate of the discharge transistor MN0 are connected to each other and to an output terminal of the inverter 450. The K additional current sources 440 are connected to the drain of the discharge transistor MN0 through the selection network 430. The current source selection circuit controls the selection network 430 based on the reading pulse and the control signal, such that when the K additional current sources 440 are all not conductive with the drain of the discharge transistor MN0, a pull-up current source conductive with the drain of the discharge transistor MN0 is formed by the reference current source I0.

The current source selection circuit 410 controls the selection network 430 based on the reading pulse and the control signal, such that when one of the additional current sources 440 is conductive with the drain of the discharge transistor MN0, the pull-up current source conductive with the drain of the discharge transistor MN0 is formed by superimposing the reference current source $I_0$ and the additional current source that is conductive. Therefore, one reference current source and the K additional current sources jointly form K+1 different pull-up current sources.

Figure 3:
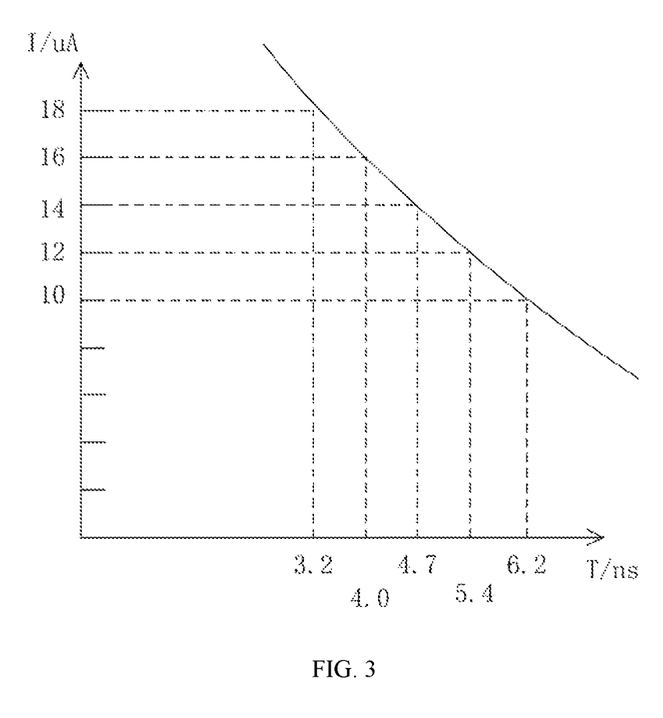
FIG. 3 is a schematic diagram showing a correspondence between different reading times and current sizes of pull-up current sources in an example.

In the example shown in FIG. 1, assuming that $I_0$=10 uA, $I_1$=8 uA, $I_2$=6 uA, $I_3$=4 uA, and $I_4$=2 uA, the following five pull-up current sources of different sizes can be formed: 10 uA pull-up current source realized only by $I_0$, 12 uA pull-up current source realized by superimposing $I_0$ and $I_4$, 14 uA pull-up current source realized by superimposing $I_0$ and $I_3$, 16 uA pull-up current source realized by superimposing $I_0$ and $I_2$, and 18 uA pull-up current source realized by superimposing $I_0$ and $I_1$. Therefore, the 10 uA, 12 uA, 14 uA, 16 uA, and 18 uA pull-up current sources can be realized. A relationship between the corresponding reading time of these five pull-up current sources is shown in FIG. 3. It can be seen that a shorter reading time T required leads to a larger pull-up current source. Then, one of the five pull-up current sources is selected based on the required reading time.

In an embodiment, the selection network 430 includes K selection PMOS transistors, and the current source selection circuit 410 includes K logic NAND gates. Each of the additional current sources 440 is connected to a source of a corresponding selection PMOS transistor. As shown in FIG. 1, the additional current sources $I_1$, $I_2$, $I_3$, and $I_4$ are respectively connected to PMOS transistors MP1, MP2, MP3, and MP4. Drains of the selection PMOS transistors are all connected to the drain of the discharge transistor MN0.

One input terminal of each of the logic NAND gates in the current source selection circuit 410 is connected to the reading time control circuit 200 to obtain one control bit of the control signal. The other input terminal of each of the logic NAND gates in the current source selection circuit 410 is connected to the programmable reading pulse generation circuit to obtain the reading pulse. An output terminal of each of the logic NAND gates in the current source selection circuit 410 is connected to a gate of a corresponding selection PMOS transistor.

The K logic NAND gates in the current source selection circuit 410 respectively obtain the K control bits of the control signal to control on/off of one corresponding selection PMOS transistor, thereby controlling on/off of the connected additional current source 440 and the drain of the discharge transistor MN0.

4. Reading Register 500

A D terminal of the reading register 500 is connected to the output terminal of the reading amplification circuit 400 to obtain the read data, and a Q terminal of the reading register 500 can output the registered data DATA. The output terminal of the programmable reading pulse generation circuit 300 is connected to a clk terminal of the reading register 500 through the inverter. Further, in an embodiment, the reading register 500 is designed by a triple modular redundancy technology, which can improve overall radiation hardening performance.

The above merely describes preferred implementations of the present disclosure, and the present disclosure is not limited to the above embodiments. It is understood that improvements and modifications directly derived from or associated with the present disclosure by those skilled in the art do not depart from the spirit and concept of the present disclosure and should be regarded as being within the protection scope of the present disclosure.

What is claimed is:

1. An anti-fuse memory reading circuit with controllable reading time comprising an anti-fuse memory cell, wherein the anti-fuse memory reading circuit comprises a reading time control circuit, a programmable reading pulse generation circuit, a reading amplification circuit, and a reading register;

the reading time control circuit generates a control signal and provides the control signal to the programmable reading pulse generation circuit and the reading amplification circuit, wherein the control signal has K control bits and corresponds to a reading time;

based on a clock signal, the programmable reading pulse generation circuit generates a reading pulse with a pulse width corresponding to the control signal and outputs the reading pulse to the reading amplification circuit; and the reading amplification circuit comprises a plurality of pull-up current sources of different sizes, wherein based on the reading pulse and the control signal, the reading amplification circuit selects a pull-up current source corresponding to the reading time, pulls up a voltage on a bit line (BL) of the anti-fuse memory cell, reads data stored in the anti-fuse memory cell starting from a rising edge of the reading pulse, and latches the read data into the reading register at a falling edge of the reading pulse.

2. The anti-fuse memory reading circuit according to claim 1, wherein as the reading time decreases, the pulse width of the reading pulse corresponding to the reading time decreases and a current value of the pull-up current source increases.

3. The anti-fuse memory reading circuit according to claim 1, wherein the reading time control circuit comprises K programming branches, wherein the K programming branches are connected in parallel, and each of the K programming branches comprises a pull-up device and a pull-down device, wherein the pull-up device and the pull-down device are connected in series;

each of the K programming branches is connected to a power supply VDD through the pull-up device and connected to the ground GND through the pull-down device; a common end of the pull-up device and the pull-down device in each of the K programming branches is connected to a programming switch; the other terminals of the K programming switches are connected to each other and to a programming voltage HV_PGM; the reading time control circuit obtains a programming signal and controls on/off of the K programming switches based on the programming signal to program the corresponding programming branches; the common end of the pull-up device and the pull-down device in each of the K programming branches is configured to output one control bit of the control signal, and at most only one control bit in the control signal is 1.

4. The anti-fuse memory reading circuit according to claim 3, wherein the pull-up device and the pull-down device in the reading time control circuit are respectively realized by a pull-up anti-fuse and a pull-down anti-fuse, wherein a voltage difference between upper and lower metal electrode plates of the pull-up anti-fuse is a difference between the programming voltage HV_PGM and a voltage of the power supply VDD, and a voltage difference between upper and lower metal electrode plates of the pull-down anti-fuse is a difference between the programming voltage HV_PGM and a voltage of the ground GND; and anti-fuses in the corresponding programming branches are programmed by controlling on/off of the K programming switches based on the programming signal to apply the programming voltage HV_PGM to two ends of the pull-up anti-fuse and two ends of the pull-down anti-fuse separately to complete programming of the pull-up anti-fuse and the pull-down anti-fuse, wherein     when the pull-up anti-fuse is programmed, the voltage of the power supply VDD and the voltage of the ground GND are adjusted, such that the voltage difference between the upper and lower metal electrode plates of the pull-up anti-fuse exceeds a breakdown voltage of the pull-up anti-fuse, and the voltage difference between the upper and lower metal electrode plates of the pull-down anti-fuse is less than the breakdown voltage of the pull-down anti-fuse, to complete the programming of the pull-up anti-fuse; and     when the pull-down anti-fuse is programmed, the voltage of the power supply VDD and the voltage of the ground GND are adjusted, such that the voltage difference between the upper and lower metal electrode plates of the pull-down anti-fuse exceeds the breakdown voltage of the pull-down anti-fuse, and the voltage difference between the upper and lower metal electrode plates of the pull-up anti-fuse is less than the breakdown voltage of the pull-up anti-fuse, to complete the programming of the pull-down anti-fuse, wherein a resistance value of each of the pull-up anti-fuse and the pull-down anti-fuse is several hundred megaohms when each of the pull-up anti-fuse and the pull-down anti-fuse is not programmed.

5. The anti-fuse memory reading circuit according to claim 1, wherein the programmable reading pulse generation circuit comprises a delay circuit, K delay selection switches, and a logic AND gate, wherein the clock signal CLK is input into the delay circuit, and the delay circuit performs multi-stage delaying on the clock signal CLK and leads out clock delay signals with different delay values relative to the clock signal CLK at K different delay stages; each of the clock delay signals is connected to each of the K delay selection switches, and the other terminals of the K delay selection switches are connected to each other and to a first input terminal of the logic AND gate; a second input terminal of the logic AND gate is connected to the clock signal CLK, and an output terminal of the logic AND gate is connected to the reading amplification circuit to output the reading pulse, wherein     the K delay selection switches are respectively controlled by the K control bits of the control signal, and a delay selection switch of the K delay selection switches is closed when the corresponding control bit is at a high level and outputs the corresponding clock delay signal to the logic AND gate; and as a delay value of the clock delay signal relative to the clock signal CLK increases, the pulse width of the reading pulse increases.

6. The anti-fuse memory reading circuit according to claim 1, wherein the reading amplification circuit comprises a negative channel metal oxide semiconductor (NMOS) discharge transistor MN0, the plurality of pull-up current sources of different sizes, and a current source selection circuit;

a source of the NMOS discharge transistor MN0 is grounded, and a drain of the NMOS discharge transistor MN0 is connected to the reading register through a buffer; an output end of the programmable reading pulse generation circuit is connected to a gate of the NMOS discharge transistor MN0 through an inverter; the plurality of pull-up current sources of different sizes are connected to the drain of the NMOS discharge transistor MN0 through a selection network, and the drain of the NMOS discharge transistor MN0 is further connected to the BL of the anti-fuse memory cell; and     based on the reading pulse and the control signal, the current source selection circuit controls the selection network to allow the pull-up current source corresponding to the reading time to be conductive with the drain of the NMOS discharge transistor MN0.

7. The anti-fuse memory reading circuit according to claim 6, wherein the reading amplification circuit comprises a reference current source and K additional current sources, wherein the reference current source is connected to a source of a corresponding positive channel metal oxide semiconductor (PMOS) transistor; a drain of the PMOS transistor connected to the reference current source is connected to the drain of the NMOS discharge transistor MN0; a gate of the PMOS transistor connected to the reference current source and the gate of the NMOS discharge transistor MN0 are connected to each other and to an output terminal of the inverter;

and the K additional current sources are connected to the drain of the NMOS discharge transistor MN0 through the selection network;

the current source selection circuit controls the selection network based on the reading pulse and the control signal, such that when the K additional current sources are not conductive with the drain of the NMOS discharge transistor MN0, a pull-up current source conductive with the drain of the NMOS discharge transistor MN0 is formed by the reference current source; and     the current source selection circuit controls the selection network based on the reading pulse and the control signal, such that when an additional current source of the K additional current sources is conductive with the drain of the NMOS discharge transistor MN0, the pull-up current source conductive with the drain of the NMOS discharge transistor MN0 is formed by superimposing the reference current source and the additional current source that is conductive with the drain of the NMOS discharge transistor MN0, wherein the reference current source and the K additional current sources jointly form K+1 different pull-up current sources.

8. The anti-fuse memory reading circuit according to claim 7, wherein the selection network comprises K selection PMOS transistors, and the current source selection circuit comprises K logic NAND gates;

each of the K additional current sources is correspondingly connected to a source of each of the K selection PMOS transistors, and drains of the K selection PMOS transistors are connected to the drain of the NMOS discharge transistor MN0;

a first input terminal of each of the K logic NAND gates in the current source selection circuit is connected to the reading time control circuit to obtain one control bit of the control signal, a second input terminal of each of the K logic NAND gates in the current source selection circuit is connected to the programmable reading pulse generation circuit to obtain the reading pulse, and an output terminal of each of the K logic NAND gates in the current source selection circuit is correspondingly connected to a gate of each of the K selection PMOS transistors; and the K logic NAND gates in the current source selection circuit respectively obtain the K control bits of the control signal to control on/off of one corresponding selection PMOS transistor.

9. The anti-fuse memory reading circuit according to claim 6, wherein the reading amplification circuit reads the data stored in the anti-fuse memory cell starting from the rising edge of the reading pulse; and when the reading amplification circuit reads that the anti-fuse memory cell is in an unprogrammed high impedance state, the drain of the NMOS discharge transistor MN0 is pulled up to a high level; when the reading amplification circuit reads that the anti-fuse memory cell is in a programmed low impedance state, the drain of the NMOS discharge transistor MN0 remains at a low level, and the read data is sent to the reading register.

10. The anti-fuse memory reading circuit according to claim 1, wherein the reading register is designed by a triple modular redundancy technology.

\* \* \* \* \*